(12) United States Patent
Lee et al.

(10) Patent No.: US 7,454,672 B2
(45) Date of Patent: Nov. 18, 2008

(54) SEMICONDUCTOR MEMORY DEVICE TESTABLE WITH A SINGLE DATA RATE AND/OR DUAL DATA RATE PATTERN IN A MERGED DATA INPUT/OUTPUT PIN TEST MODE

(75) Inventors: Jong-Cheol Lee, Seongnam-si (KR); Su-Chul Kim, Gunpo-si (KR); Uk-Rae Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 565 days.

(21) Appl. No.: 10/748,906

(22) Filed: Dec. 30, 2003

(65) Prior Publication Data

US 2004/0151039 A1    Aug. 5, 2004

(30) Foreign Application Priority Data

Jan. 24, 2003    (KR) ............... 10-2003-0004807

(51) Int. Cl.
*G11C 29/00*    (2006.01)
*G11C 7/00*    (2006.01)

(52) U.S. Cl. ................................. 714/720; 365/201
(58) Field of Classification Search ............. 714/718, 714/720; 365/200, 201
See application file for complete search history.

(56) References Cited

U.S. PATENT DOCUMENTS

| | | | | |
|---|---|---|---|---|
| 5,008,886 | A | * | 4/1991 | Chinnaswamy et al. ...... 714/764 |
| 6,317,372 | B1 | * | 11/2001 | Hayashi et al. ............. 365/201 |
| 6,516,363 | B1 | * | 2/2003 | Porter et al. ................... 710/60 |

FOREIGN PATENT DOCUMENTS

| JP | 2000-207900 | 7/2000 |
|---|---|---|
| KR | 10-2000-0062531 A | 10/2000 |

* cited by examiner

*Primary Examiner*—Cynthia Britt
(74) *Attorney, Agent, or Firm*—F. Chau & Assoc., LLC

(57) ABSTRACT

Provided is a semiconductor memory device testable with a single data rate (SDR) or a dual data rate (DDR) pattern in a merged data input/output pin (DQ) test mode. The device includes a first path circuit, a second path circuit, and a merged output generator configured to generate a merged data bit having a SDR and/or DDR pattern.

16 Claims, 4 Drawing Sheets

SEMICONDUCTOR MEMORY DEVICE TESTABLE WITH A SINGLE DATA RATE AND/OR DUAL DATA RATE PATTERN IN A MERGED DATA INPUT/OUTPUT PIN TEST MODE

BACKGROUND OF THE INVENTION

1. Technical Field

The present invention relates to semiconductor memory devices and, more specifically, to semiconductor memory devices which are testable with a single data rate (SDR) and/or dual date rate (DDR) pattern in a merged data input/output pin (DQ) test mode.

2. Discussion of the Related Art

Testing semiconductor memory devices can be divided into two procedures when fabricating from raw wafers to completely packaged products. One procedure is a wafer test for detecting defects on a wafer where semiconductor chips have been manufactured. Another procedure is a package test for detecting defects in packaged products after the wafer test. Semiconductor products subject to these test procedures may typically be required to satisfy prior design specifications.

These design specifications tend to increase the number of input/output pins in semiconductor memory devices because of the need for higher capacities, integration densities, and facilities. Usually a test procedure is conducted by comparing actual data with expected (or desired) data by connecting the input/output pins of a semiconductor memory device to the channels of a tester (or testing equipment). Based on the comparison result, one may determine whether or not there is a defect in the tested semiconductor memory device. Even though a large number of test channels are found in a typical tester, the increasing number of input/output pins in common semiconductor memory devices may reduce the number of semiconductor memory devices capable of being tested at one time by a tester. In addition, the increasing number of input/output pins relative to the limited number of test channels may increase test time for the semiconductor memory devices and thereby, increase the cost of the test and reduce the productivity of the tester.

In order to overcome the limited number of test channels in a tester versus the number of input/output pins in a semiconductor memory device, a merged DQ test scheme has been proposed. The merged DQ test scheme assigns the input/output pins (e.g., DQ pins) of a memory device to a single pin of a tester. Data bits to be output through a plurality of DQ pins are internally compared with each other (or an expected data bit), and then, as a single bit, the comparison result is output to the single pin of the tester. By unifying a plurality of DQ pins to a single test channel (or a single test pin) the number of semiconductor memory devices testable is increased and the test cost is reduced.

FIG. 1 illustrates an example of the merged DQ test scheme for use with a semiconductor memory device. A semiconductor memory device 100 to be tested is comprised of data latches 110, a data comparator 130, a data combiner 150, a merging controller 170, and output buffers 180 (including buffers 190-198). The data latches 110 hold internal data bits I/O0-I/O8 of the memory device 100, in response to an internal clock signal KCORE. The internal data bits I/O0-I/O8 in the data latches 110 are transferred to the output buffers 180 through de-multiplexers DMUX during an inactive state of a merging signal MDQ and through the data comparator 130 during an active state of the merging signal MDQ. In a normal operation mode, not a test mode, the output buffers 180 output the latched data bits I/O0-I/O8 through DQ pads (DQ0-DQ8) (or pins).

In a merged DQ test mode, the data comparator 130 compares the latched data bits I/O0-I/O8 to each other and then transfers the comparison results to the data combiner 150. In the data combiner 150, the comparison results are put into an exclusive-OR (XOR) logic circuit and an output of the XOR logic circuit is applied to the merging controller 170 as an output DOUTMDQB in response to the merging signal MDQ. The merging controller 170 transfers its own output DOUTMDQ to one of the output buffers 190-198, e.g., output buffer 195, in response to an output clock signal KDATA and a merging flag signal MFLAG. An output from the output buffer 195 is transmitted to its corresponding DQ pad DQ5 by control of an output enable generator that responds to the merging signal MDQ and provides an output enable signal to permit data to be output to the output buffer's 195 DQ pad DQ5. Therefore, the DQ pad DQ5 selected as an output terminal for the merged data bit becomes a merged DQ pad in the merged DQ test mode.

The data combiner 150 generates two outputs: one is a first merging data bit DOUTMDQB_W that is active at a rising edge of the clock signal; the other is a second merging data bit DOUTMDQB_X that is active at a falling edge of the clock signal. Referring to FIG. 2, which shows a circuit diagram of the merging controller shown in FIG. 1, in the merging controller 170, the first and second merging data bits, DOUTMDQB_W and DOUTMDQB_X, alternatively trigger the output DOUTMDQ in response to output clock signals KDATA_W1 and KDATA_X1, respectively when the merging flag signal MFLAG is active with a high level logically.

During this procedure, the output DOUTMDQ of the merging controller 170 is conductive in an SDR mode because the output clock signals KDATA_W1 and KDATA_X1 are not simultaneously enabled even though the merging data bits DOUTMDQB_W and DOUTMDQB_X are conductive in a DDR mode. Thus, the merging controller 170 does not operate in the DDR mode, rather it operates in the SDR mode while the data combiner 150 is operable in the DDR mode.

Therefore, the merged DQ test scheme with the merging controller shown in FIG. 2 is unavailable in the DDR mode required for high bandwidth synchronous semiconductor memory devices.

SUMMARY OF THE INVENTION

It is, therefore, an object of the present invention to provide a semiconductor memory device having a merged data input/output pin (DQ) test function with a dual data rate (DDR) operation mode.

In accordance with the present invention, a semiconductor memory device operable in a merged DQ test mode, includes: a first path circuit; a second path circuit; and a merged output generator configured to generate a merged data bit having a single data rate (SDR) pattern and/or a dual data rate pattern.

The semiconductor memory device further includes a control-signal generator configured to generate a first and second SDR signal and a first and second transmission signal pair.

BRIEF DESCRIPTION OF THE DRAWINGS

The forgoing features of the invention will become more apparent by describing in detail exemplary embodiments thereof with reference to the attached drawings, in which.

DESCRIPTION OF EXEMPLARY EMBODIMENTS

Figure 1:
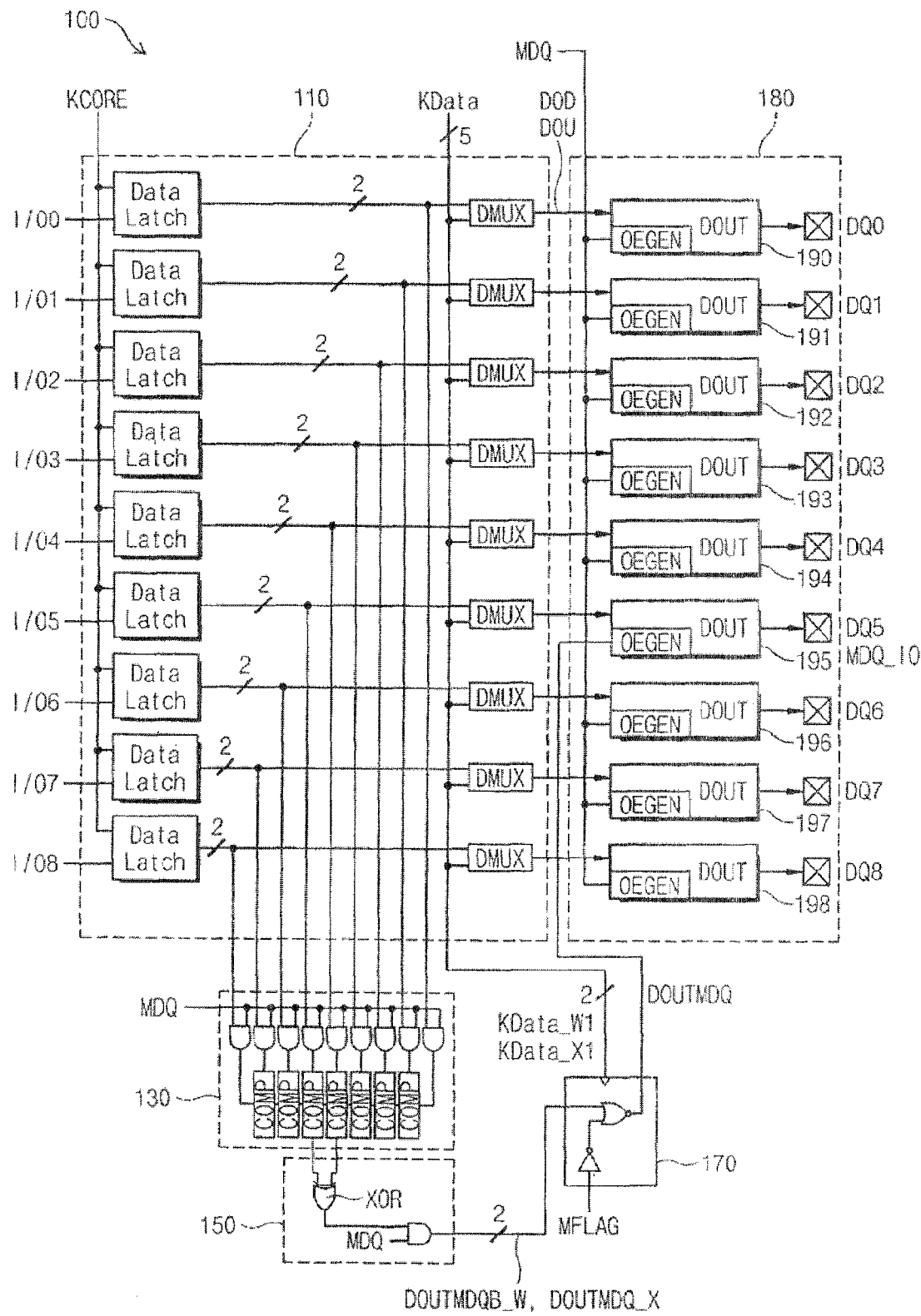
FIG. 1 is a circuit diagram illustrating an example of a merged data input/output pin (DQ) test mode in a semiconductor memory device.
Figure 2:
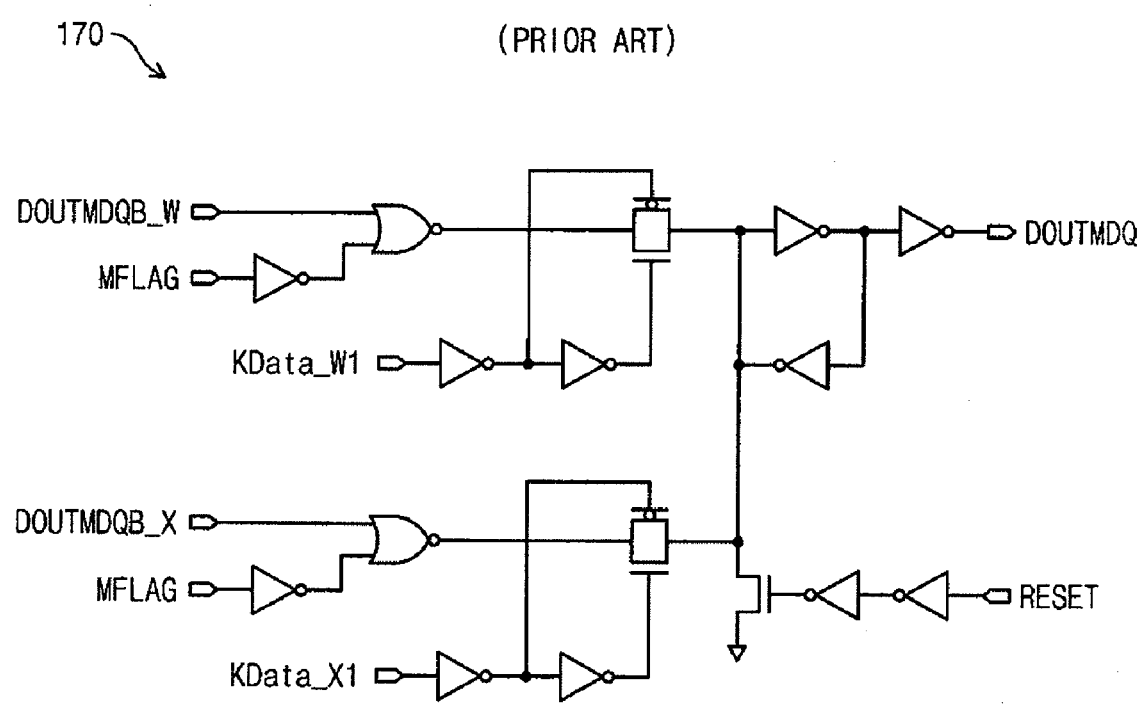
FIG. 2 is a circuit diagram of the merging controller shown in FIG. 1.
Figure 3:
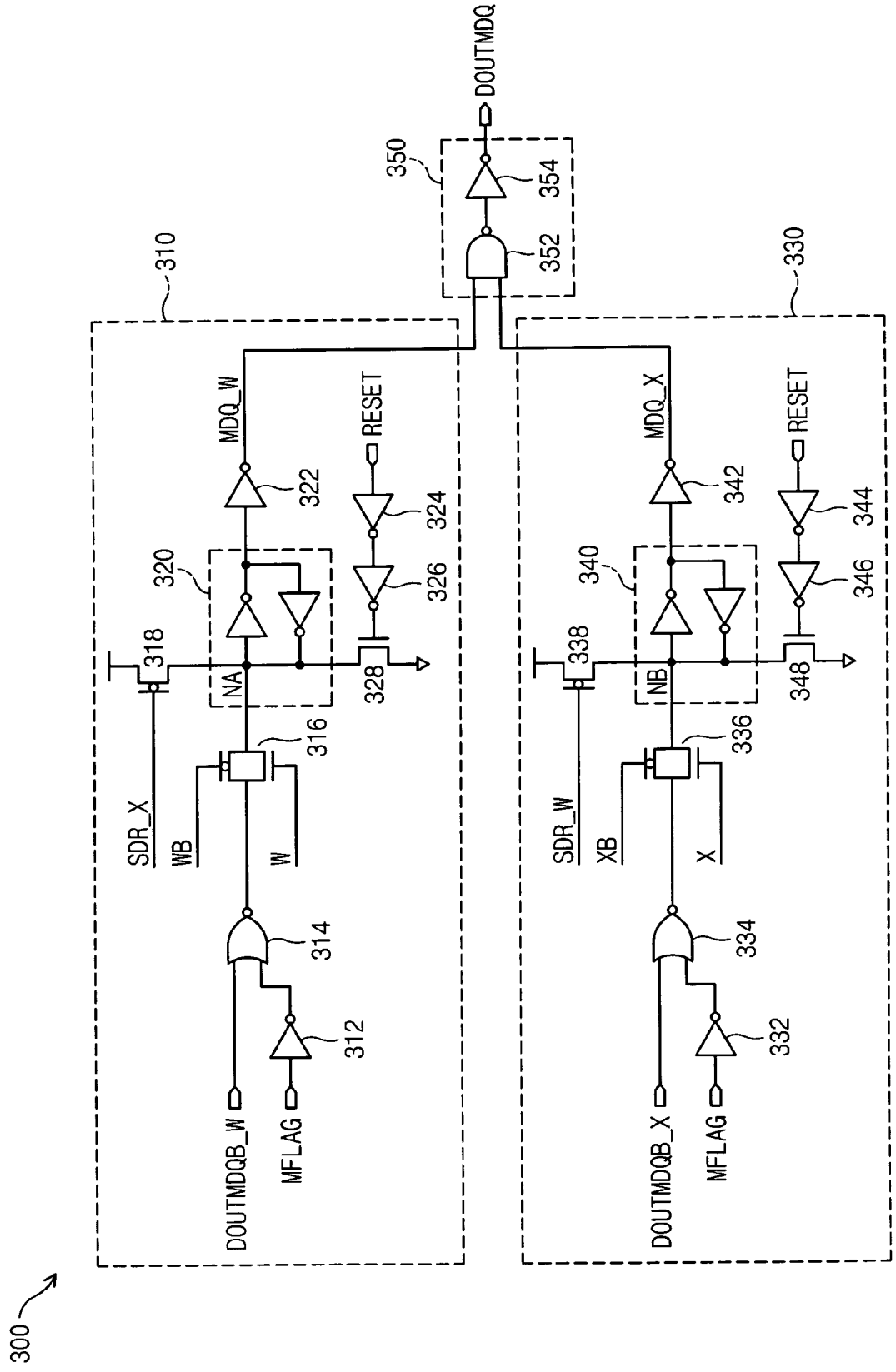
FIG. 3 is a circuit diagram of a merging controller according to an exemplary embodiment of the present invention.

FIG. 3 illustrates a circuit diagram of a merging controller according to an exemplary embodiment of the present invention. Referring to FIG. 3, a merging controller 300 includes a first path circuit 310, a second path circuit 330, and a merged output generator 350. The first path circuit 310 receives the first data bit DOUTMDQB_W and the merging flag signal MFLAG and then generates a first path output signal MDQ_W in response to a reset signal RESET, a second single data rate signal SDR_X, and a first transmission signal pair W/WB. The second path circuit 330 receives the second data bit DOUTMDQB_X and the merging flag signal MFLAG and then generates a second path output signal MDQ_X in response to the reset signal RESET, a first single data rate signal SDR_W, and a second transmission signal pair X/XB. The merged output generator 350 receives the output signals MDQ_W and MDQ_X from the first and second path circuits 310 and 330 and generates the merged output data bit DOUTMDQ.

The first path circuit includes an inverter 312 receiving the merging flag signal MFLAG, a NOR gate 314 receiving an output of the inverter 312 and the first data bit DOUTMDQB_W, a transmission gate 316 switching an output of the NOR gate 314 in response to the first transmission signal pair W/WB, a PMOS transistor 318 controlled by the second single data rate signal SDR_X, a latch 320 retaining a current voltage level at a node NA, a second inverter 322 turning an output of the latch 320 to the output signal MDQ_W, an inverter 324 receiving the reset signal RESET, an inverter 326 receiving an output of the inverter 324, and an NMOS transistor 328 resetting the node NA in response to an output of the inverter 326. The second path circuit 330 is constructed similar to the first path circuit 310 and includes inverters 332, 342, 344, and 346, a NOR gate 334, a transmission gate 336, a PMOS transistor 338, a latch 340, and an NMOS transistor 348. The output signals of the first and second path circuits, MDQ_W and MDQ_X, are applied to the merged output generator 350. The merged output generator 350 includes a NAND gate 352 receiving the first and second path output signals, MDQ_W and MDQ_X, and an inverter 354 converting an output of the NAND gate 352 to the merged output data bit DOUTMDQ.

Figure 4:
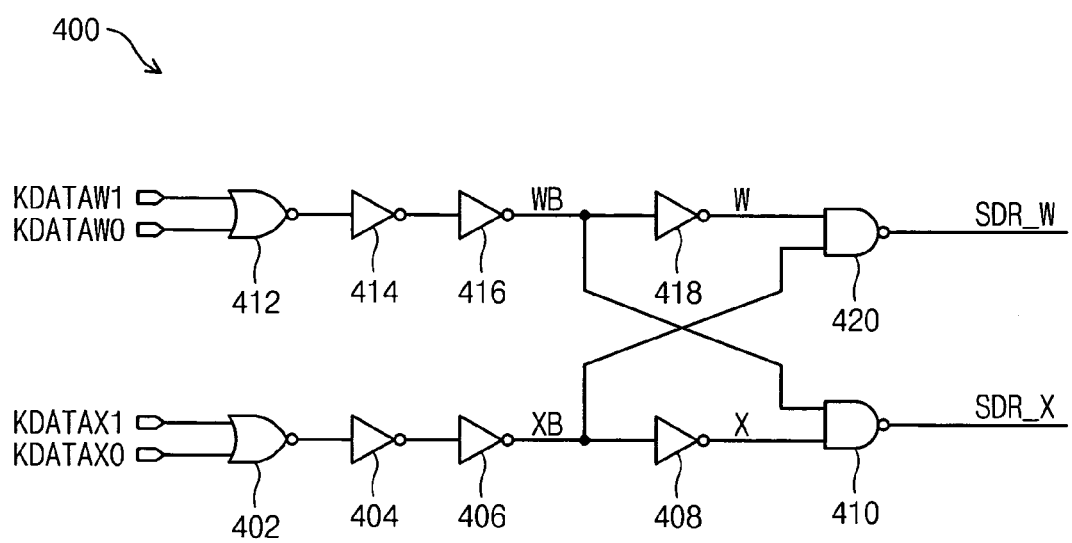
FIG. 4 is a circuit diagram of a control signal generator according to an exemplary embodiment of the present invention.

A control signal generator 400 providing the first and second transmission signal pairs, W/WB and X/XB, and the first and second single data rate signals, SDR_W and SDR_X, is illustrated in FIG. 4. Referring to FIG. 4, the control signal generator 400 outputs the first and second transmission signal pairs, W/WB and X/XB, and the first and second single data rate signals, SDR_W and SDR_X, in response to output clock signals KDATAW0, KDATAW1, KDATAX0, and KDATAX1. The output clock signals KDATAW0, KDATAW1, KDATAX0, and KDATAX1 are activated in various combinational patterns according to a burst type and a current data rate mode (single data rate (SDR) and/or dual data rate (DDR)) as shown in the following Table 1.

TABLE 1

| | Burst Type | | | |
| --- | --- | --- | --- | --- |
| | First | Second | Third | Fourth |
| | | Flag Address | | |
| | 00 | 01 | 10 | 11 |
| DDR | KDATAW1 | KDATAW0 | KDATAW1 | KDATAW0 |
| | KDATAX0 | KDATAX1 | KDATAX0 | KDATAX1 |
| SDR | KDATAW1 | KDATAX1 | KDATAW1 | KDATAX1 |
| | KDATAW0 | KDATAX0 | KDATAW0 | KDATAX0 |

As shown in Table 1, the flag address determines a burst type, among the first through fourth types, of a semiconductor memory device such as a DDR static random access memory (SRAM).

The control signal generator 400 includes a NOR gate 402 receiving the first and second output clock signals KDATAX0 and KDATAX1, inverters 404, 406, and 408 serially connected from an output of the NOR gate 402, a NAND gate 410 outputting the second single data rate signal SDR_X, a NOR gate 412 receiving the third and fourth output clock signals KDATAW0 and KDATAW1, inverters 414, 416, and 418 serially connected from an output of the NOR gate 412, a NAND gate 420 outputting the first single data rate signal SDR_W. Outputs of the inverters 406 and 408 become the second complementary transmission signal pair XB and the second (i.e., main) transmission signal X respectively, and outputs of the inverters 416 and 418 become the first complementary transmission signal WB and the first (i.e., main) transmission signal W. The NAND gate 410 inputs the first complementary transmission signal WB and the second transmission signal X and then outputs the second single data rate signal SDR_X. The NAND gate 420 inputs the second complementary transmission signal XB and the first transmission signal W and then outputs the first single data rate signal SDR_W.

In the DDR mode with the first burst type, the second and third output clock signals, KDATAW1 and KDATAX0, are set to high levels. And, the first and second transmission signals W and X go to high levels (their complementary signals WB and XB are at low levels) while the first and second single data rate signals SDR_W and SDR_X are set to high levels.

In the SDR mode with the first burst type, the first and second output clock signals, KDATAW0 and KDATAW1, are set to high levels. And, the first and second transmission signals W and X go to high and low levels respectively (their complementary signals WB and XB are at low and high levels respectively) while the first and second single data rate signals SDR_W and SDR_X are set to low and high levels.

The merging controller 300 operates in a merged data input/output pin (DQ) test mode with the signals provided from the control signal generator 400. In the merged DQ test mode, the merging flag signal MFLAG is set to a high level.

In the DDR mode with the first burst type, the first and second single data rate signals SDR_W and SDR_X go to a high level to turn the PMOS transistors 318 and 338 off. During this, the first and second transmission signals, W and X, are at low levels and the transmission gates 316 and 336 are turned on. Thus, the first data bit DOUTMDQB_W is generated as the first path output signal MDQ_W by way of the NOR gate 314, the transmission gate 316, the latch 320, and the inverter 322, while the second data bit DOUTMDQB_X is generated as the second path output signal MDQ_X by way of the NOR gate 334, the transmission gate 336, the latch 340, and the inverter 342. As a result, the first and second data bits, DOUTMDQB_W and DOUTMDQB_X, are applied to the merged output generator 350 to output the merged output data bit DOUTMDQ.

In the SDR mode with the first burst type, the first and second single data rate signals, SDR_W and SDR_X, are set to low and high levels, respectively. The first and second transmission signals, W and X, are set to high and low levels, respectively. Thus, the first data bit DOUTMDQB_W triggers the first path output signal MDQ_W through the first path circuit 310. In the second path circuit 330, as the PMOS transistor 338 is turned on in response to the first single data rate signal SDR_W, which is at a low level, the node NB is charged up to a voltage of a high level. The node NB, which is at a high level sets the second path output signal MDQ_X to a high level, which is then applied to the NAND gate 352 of the merged output signal generator 350 as an enable signal thereof. As a result, only the first data bit DOUTMDQB_W, of the two data bits, is provided to the merged output generator 350 and generated as the merged output data bit DOUTMDQ.

While the present invention has been particularly shown and described with reference to exemplary embodiments thereof, it will be understood by those skilled in the art that various modifications, additions and substitutions may be made therein without departing from the scope and spirit of the invention as described in the accompanying claims and their equivalents.

What is claimed is:

1. A semiconductor memory device operable in a merged data input/output pin (DQ) test mode, comprising:
   a first path circuit receiving a first data bit, a second single data rate (SDR) signal, and a first transmission signal pair and producing a first path output signal and including a first switching element controlled by the second single data rate signal;
   a second path circuit receiving a second data bit, a first single data rate signal, and a second transmission signal pair and producing a second path output signal and including a second switching element controlled by the first single data rate signal; and
   a merged output generator configured to generate a merged data bit based on the first path output signal and the second path output signal having a single data rate (SDR) pattern and/or a dual data rate (DDR) pattern, as determined by the first single data rate signal fed to the second switching element and the second single data rate signal fed to the first switching element and the first and second transmission signal pairs.

2. The semiconductor memory device of claim 1, further comprising a control signal generator configured to generate the first and second SDR signals fed to the second path circuit and the first path circuit, respectively, and to generate the first and second transmission signal pairs.

3. The semiconductor memory device of claim 2, wherein the control signal generator comprises:
   a first NOR gate receiving first and second output clock signals;
   first, second, and third inverters, wherein outputs of the second and third inverters are the first transmission signal pair;
   a second NOR gate receiving third and fourth output clock signals;
   fourth, fifth, and sixth inverters, wherein outputs of the fifth and sixth inverters are the second transmission signal pair;
   a first NAND gate generating the second SDR signal; and
   a second NAND gate generating the first SDR signal.

4. The semiconductor memory device of claim 3, wherein the first SDR signal is generated in response to a main signal of the first transmission signal pair and a complementary signal of the second transmission signal pair.

5. The semiconductor memory device of claim 3, wherein the second SDR signal is generated in response to a complementary signal of the first transmission signal pair and a main signal of the second transmission signal pair.

6. The semiconductor memory device of claim 2, wherein the first path circuit comprises:
   a first inverter receiving a merging flag signal;
   a NOR gate receiving an output of the first inverter and the first data bit;
   a transmission gate transferring an output of the NOR gate in response to the first transmission signal pair;
   a PMOS transistor forming the first switching element for connecting a power supply to the transmission gate in response to the second SDR signal;
   a latch holding a voltage level of an output node of the transmission gate; and
   a second inverter converting an output of the latch into the first path output signal.

7. The semiconductor memory device of claim 6, wherein the first data path circuit propagates the first data bit generated at a first edge of a clock signaL 8. The semiconductor memory device of claim 7, wherein the first edge is a rising edge of the clock signal.

9. The semiconductor memory device of claim 6, wherein the first path circuit further comprises an NMOS transistor resetting the output node of the transmission gate in response to a reset signal.

10. The semiconductor memory device of claim 2, wherein the second path circuit comprises:
    a first inverter receiving a merging flag signal;
    a NOR gate receiving an output of the first inverter and the second data bit;
    a transmission gate transferring an output of the NOR gate in response to the second transmission signal pair;
    a PMOS transistor forming the second switching element for connecting a power supply to the transmission gate in response to the first SDR signal;
    a latch holding a voltage level of an output node of the transmission gate; and
    a second inverter converting an output of the latch into the second path output signal.

11. The semiconductor memory device of claim 10, wherein the second data path circuit propagates the first data bit generated at a second edge of a clock signal.

12. The semiconductor memory device of claim 11, wherein the second edge is a falling edge of the clock signal.

13. The semiconductor memory device of claim 10, wherein the second path circuit further comprises an NMOS transistor resetting the output node of the transmission gate in response to a reset signal.

14. The semiconductor memory device of claim 1, wherein the merged output generator comprises;
    a NAND gate receiving the first and second path output signals from the first and second path circuits, respectively; and an inverter converting an output of the NAND gate into the merged data bit.

15. A semiconductor memory device for operating in a merged data input/output pin (DQ) test mode, comprising:
    a control signal generator for generating first and second single data rate (SDR) signals and first and second transmission signal pairs, wherein each signal of a pair is complementary to the other signal of the pair;

a first path circuit for receiving the second single data rate signal and one of the first and second transmission pairs and including a first switching element controlled by the second single data rate signal;

a second path circuit for receiving the first single data rate signal and the other of the first and second transmission pairs and including a second switching element controlled by the first single data rate signal; and a merged output generator for generating a merged data bit, wherein the merged data bit has an SDR or dual data rate (DDR) pattern depending upon the first single data rate signal fed to the second switching element and the second single data rate signal fed to the first switching element as determined by a respective plurality of output clock signals fed to the control signal generator.

16. The semiconductor memory device of claim 15, wherein the merged data bit is generated based on first and second output signals of the first and second path circuits.

* * * * *